United States Patent
Seidemann et al.

(10) Patent No.: US 9,209,143 B2
(45) Date of Patent: Dec. 8, 2015

(54) DIE EDGE SIDE CONNECTION

(71) Applicant: Intel IP Corporation, Santa Clara, CA (US)

(72) Inventors: Georg Seidemann, Landshut (DE);
Sven Albers, Regensburg (DE); Teodora Ossiander, Sinzing (DE); Michael Skinner, San Jose, CA (US);
Hans-Joachim Barth, Munich (DE);
Harald Gossner, Reimerling (DE);
Reinhard Mahnkopf, Oberhaching (DE); Christian Mueller, Bottrop (DE);
Wolfgang Molzer, Ottobrunn (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/038,248

(22) Filed: Sep. 26, 2013

(65) Prior Publication Data
US 2015/0084202 A1     Mar. 26, 2015

(51) Int. Cl.
*H01L 23/48*     (2006.01)
*H01L 23/52*     (2006.01)
*H01L 29/40*     (2006.01)
*H01L 23/00*     (2006.01)
(Continued)

(52) U.S. Cl.
CPC ............... *H01L 24/09* (2013.01); *H01L 24/03* (2013.01); *H01L 24/05* (2013.01); *H01L 24/06* (2013.01); *H01L 24/08* (2013.01); *H01L 25/0655* (2013.01); *H01L 25/50* (2013.01); *H01L 24/13* (2013.01); *H01L 24/48* (2013.01); *H01L 24/80* (2013.01); *H01L 24/81* (2013.01); *H01L 2224/0346* (2013.01); *H01L 2224/03444* (2013.01); *H01L 2224/0401* (2013.01); *H01L 2224/04042* (2013.01); *H01L 2224/05009* (2013.01); *H01L 2224/05013* (2013.01); *H01L 2224/05014* (2013.01); *H01L 2224/05015* (2013.01); *H01L 2224/05016* (2013.01); *H01L 2224/0558* (2013.01); *H01L 2224/05556* (2013.01); *H01L 2224/05573* (2013.01); *H01L 2224/05644* (2013.01); *H01L 2224/05655* (2013.01); *H01L 2224/05664* (2013.01); *H01L 2224/06135* (2013.01); *H01L 2224/06183* (2013.01); *H01L 2224/08054* (2013.01);
(Continued)

(58) Field of Classification Search
CPC .............. H01L 25/042; H01L 25/0652; H01L 25/0655; H01L 25/0657; H01L 25/071; H01L 25/072; H01L 25/0753; H01L 25/0756; H01L 25/115; H01L 25/117
USPC ......... 257/777, 778, 723, 690, 734, 782, 783; 361/760, 761, 764, 803
See application file for complete search history.

(56) References Cited

U.S. PATENT DOCUMENTS 5,126,286 A * 6/1992 Chance .................. 438/462
5,401,672 A * 3/1995 Kurtz et al. .............. 438/107
(Continued)

*Primary Examiner* — Thanh Y Tran
(74) *Attorney, Agent, or Firm* — Schwegman Lundberg & Woessner, P.A.

(57) ABSTRACT

An apparatus comprises a first integrated circuit (IC) die that includes a top layer, a bottom surface, a sidewall surface extending from a top surface of the top layer to the bottom surface, and at least one multi-surface contact pad, a second IC die including a top layer, a bottom surface, a sidewall surface extending from a top surface of the top layer to the bottom surface, and at least one multi-surface contact pad, wherein the second IC die is arranged adjacent to the first IC die, and includes an electrically conductive bond in contact with at least one of the top surface or the side surface of the multi-surface contact pad of the first IC die and the top surface of the multi-surface contact pad of the second IC die.

24 Claims, 6 Drawing Sheets

(51) Int. Cl.
*H01L 25/065* (2006.01)
*H01L 25/00* (2006.01)

(52) U.S. Cl.
CPC ............... *H01L2224/08056* (2013.01); *H01L 2224/08057* (2013.01); *H01L 2224/08137* (2013.01); *H01L 2224/08225* (2013.01); *H01L 2224/09135* (2013.01); *H01L 2224/09183* (2013.01); *H01L 2224/131* (2013.01); *H01L 2224/16137* (2013.01); *H01L 2224/48137* (2013.01); *H01L 2224/80201* (2013.01); *H01L 2224/80895* (2013.01); *H01L 2224/81203* (2013.01); *H01L 2224/94* (2013.01); *H01L 2924/1434* (2013.01)

(56) References Cited

U.S. PATENT DOCUMENTS

| | | | |
|---|---|---|---|
| 5,668,409 A * | 9/1997 | Gaul | 257/723 |
| 6,611,050 B1 * | 8/2003 | Ference et al. | 257/679 |
| 7,612,443 B1 * | 11/2009 | Bernstein et al. | 257/685 |
| 8,623,700 B1 * | 1/2014 | Bernstein et al. | 438/107 |
| 2007/0158807 A1 * | 7/2007 | Lu et al. | 257/686 |
| 2008/0017971 A1 * | 1/2008 | Hollis | 257/698 |
| 2008/0315388 A1 * | 12/2008 | Periaman et al. | 257/690 |
| 2010/0270668 A1 * | 10/2010 | Marcoux | 257/690 |
| 2010/0301475 A1 * | 12/2010 | Hsu et al. | 257/738 |
| 2013/0214385 A1 * | 8/2013 | Do et al. | 257/528 |

* cited by examiner

DIE EDGE SIDE CONNECTION

TECHNICAL FIELD

Embodiments described herein pertain to manufacturing of electronic systems that include integrated circuits (ICs). Some embodiments relate to interconnection of integrated circuit dice.

BACKGROUND

Electronic systems often include ICs as dice or chips that are connected to a subassembly such as a substrate or motherboard. The packaged or unpackaged IC dice are typically wire-bonded to the motherboard or substrate. In many cases the interconnection between IC dice can be relatively long, and the resistor-capacitor (RC) coupling between interconnects can complicate the interconnection routing and can reduce signal speed between dice. Also, as electronic system designs become more complex, the interconnection of ICs can include additional manufacturing steps such as complex bonding or the adding of a redistribution layer to the IC subassembly for example. These additional steps can increase the cost of the electronic system. Thus, there are general needs for methods and systems to improve the IC interconnection process.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The demand for increased processing power in smaller electronic devices has led to increased demand for smaller sizes of IC subassemblies such as multi-chip modules (MCMs) and motherboards. The interconnection between two or more IC dice or chips can be shortened by connecting the ICs using new connection methods instead of, or in addition to, wire bonding. Shorter connections can reduce RC coupling and reduce interconnection complexity. To shorten the interconnection path between ICs, connection pads of an IC die can be placed directly at the edge of the die, and IC dice can then be placed adjacent to each other. This can allow one electrically conductive bond (e.g., a single solder ball) to bridge between two connection pads of the IC dice.

Figure 1:
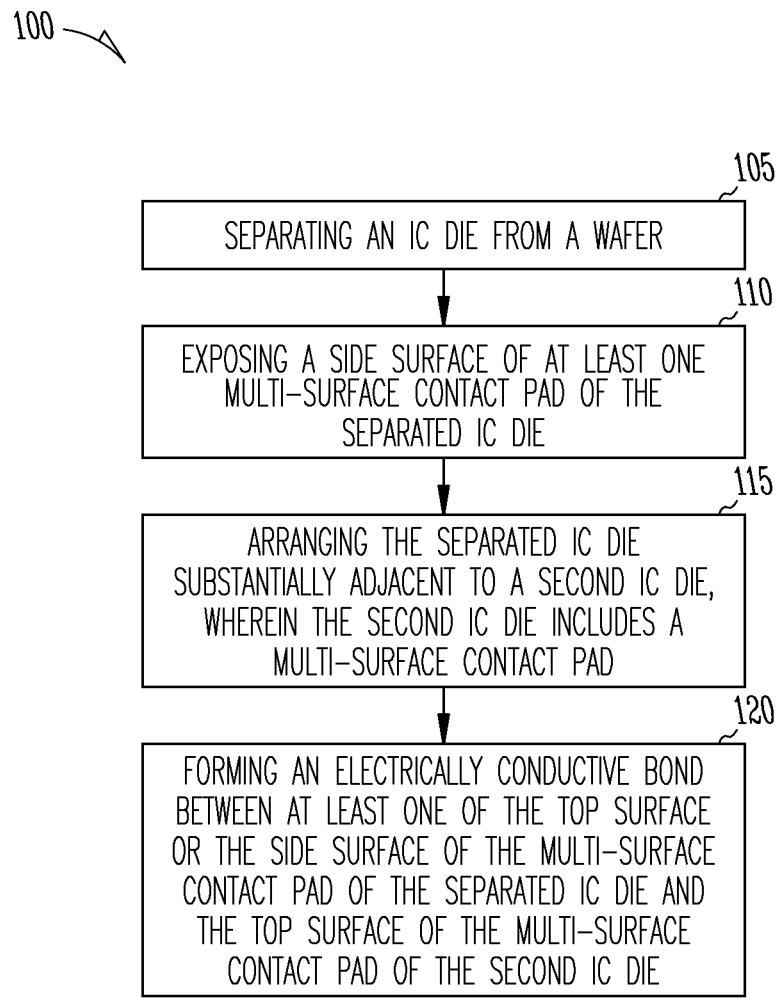
FIG. 1 shows a flow diagram of an example of a method of forming an integrated circuit assembly in accordance with some embodiments.
Figure 2:
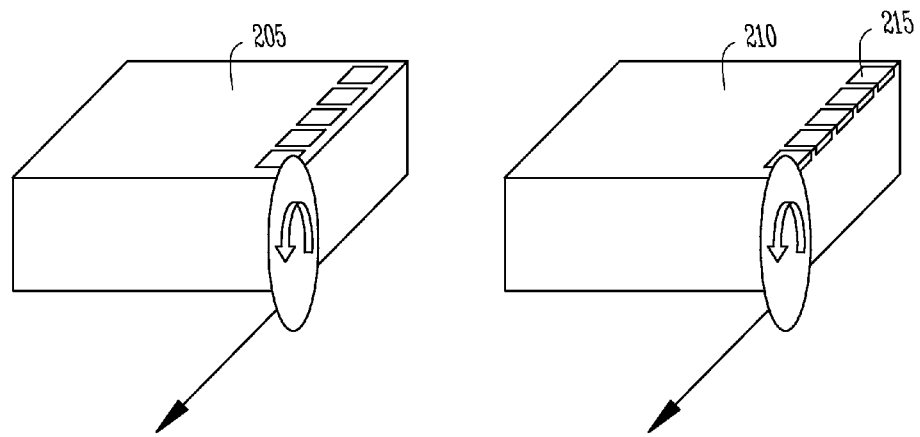
FIG. 2 illustrates examples of separating an IC die from a wafer in accordance with some embodiments.

FIG. 1 shows a flow diagram of an example of a method 100 of forming an IC assembly. At block 105, an IC die is separated from a wafer. Typically, IC dice are formed as a wafer and separated by sawing. This separating is shown in FIG. 2 in the first example 205. A wafer may include a saw street that accommodates the width of the saw blade. Sawing along the saw street leaves a gap between the contact pads and a side surface of the IC die. The separated individual IC dice can be placed via a pick and place process on a lead frame, and are finished by applying wire bods to the contact pads and packaging.

FIG. 2 also shows a second example 210 of separating an IC die from a wafer by sawing. The separated IC die includes a top layer, a bottom surface, and a sidewall surface extending from a top surface of the top layer to the bottom surface. In this example, the saw street may be narrower than in the first example and the sawing leaves a lesser gap or no gap between the contact pads and the side surface of the separated die. The separated die includes at least one multi-surface contact pad 215. The multi-surface contact pad 215 includes a top surface that can be substantially in the same plane as the top surface of the top layer of the separated IC die.

At block 110 of FIG. 1, a side surface of the multi-surface contact pad 215 is exposed. The side surface can be exposed by the sawing (e.g., cutting through a contact pad) or by an etching process for example. The side surface of the at least one multi-surface contact pad can be substantially in the same plane as the sidewall surface of the separated IC die.

Figure 3:
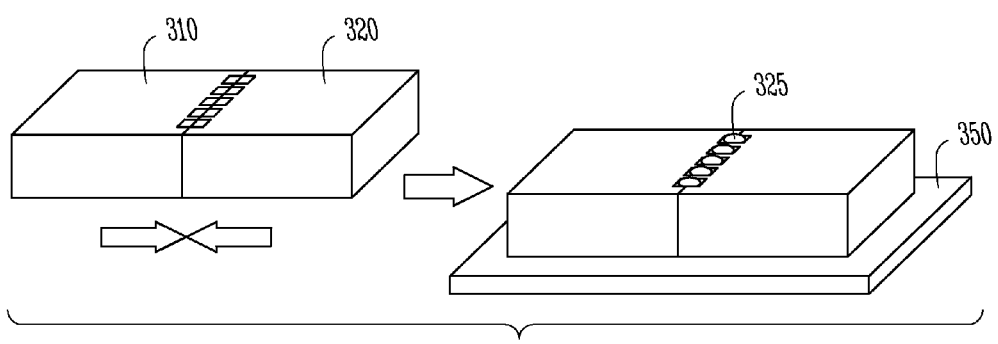
FIG. 3 illustrates an example of an IC die assembly in accordance with some embodiments.

At block 115, the separated IC die is arranged substantially adjacent to a second IC die. The second IC die includes a top layer, a bottom surface, and a sidewall surface. An example is shown in FIG. 3. The second IC die 320 includes one or more multi-surface contact pads. The multi-surface contact pads of the first IC die 310 and the second IC die 320 that are to be contacted are aligned.

Returning to FIG. 1, at block 120, an electrically conductive bond is formed between at least one of the top surface or the side surface of the multi-surface contact pad of the separated IC die and the top surface of the multi-surface contact pad of the second IC die. An example of an electrically conductive bond is shown in FIG. 3. Because the distance between the multi-surface contact pads of the first IC die 310 and the second IC die 320 is small, the electrically conductive bond 325 can be a single or unified solder mass (e.g., a solder ball formed using a ball grid array (BGA) process) or a very short wire-bond between the multi-surface contact pads. The IC die pair may then be packaged as a single unit. The IC die are shown positioned in contact with a top surface of substrate 350. It can be seen that the distance is quite reduced from the typical approach of bonding a wire to a contact of the first IC and to a package lead through a substrate and to a package lead and wire bond for the second IC. Thus, the RC coupling can be significantly reduced using the IC die assembly example of FIG.3. Although not shown, the first IC die 310 can include at least one top surface contact pad and the second IC die 320 can also include at least one top surface contact pad. The IC assembly can further include electrically conductive interconnect between the top surface contact pad of the first IC die and the top surface contact pad of the second IC die in addition to the edge-side connections.

Figure 4:
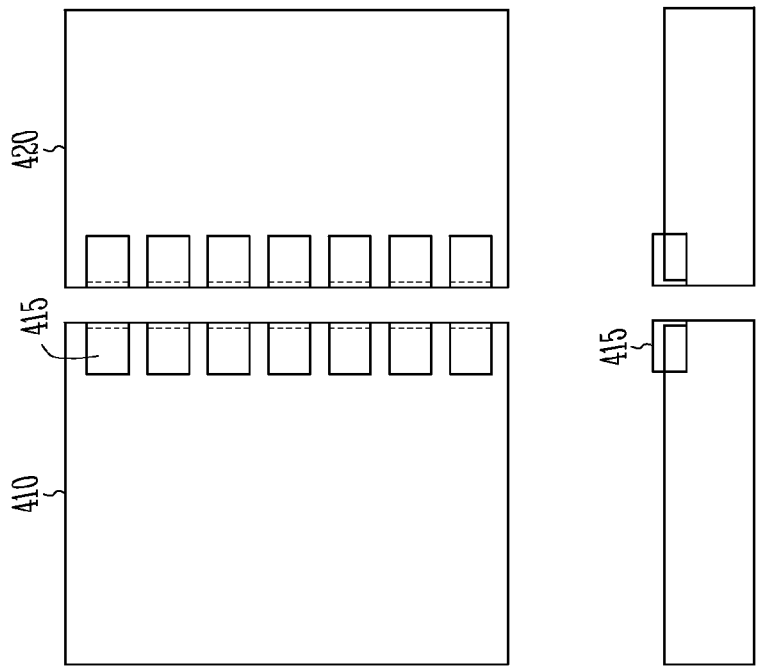
FIG. 4 illustrates another example of an IC die assembly in accordance with some embodiments.
Figure 4:
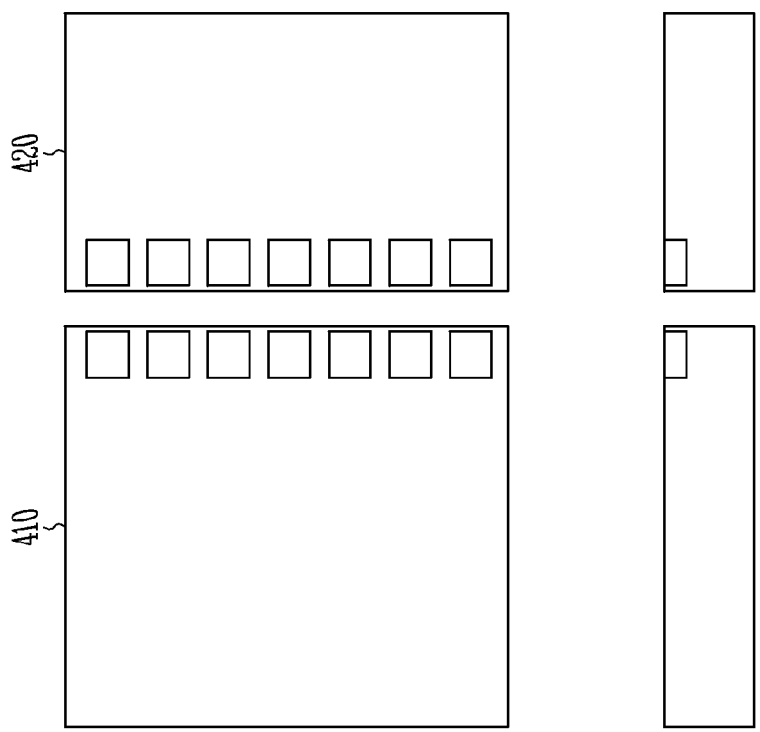

FIG. 4 shows another example of an IC die assembly. The example shows top views and side views of first IC die 410 and a second IC die 420. Metal contact pads are formed on the IC dice. Multi-surface contact pads 415 can be formed using a plating process or a deposition process after the wafer sawing (e.g., a plating process to add one or more of nickel, palladium, and gold). The multi-surface contact pad can include a first pad portion formed during a wafer metallization process and a second pad portion formed during the plating process or deposition process. One or both of the top surface and the sidewall surface of the contact pad can be completed as part of the plating or deposition process. The plating or deposition process may form a multi-surface contact pad better suited for solder bonding, or may form a multi-surface contact pad better suited for compression bonding (e.g., copper to copper compression bonding).

Figure 5:
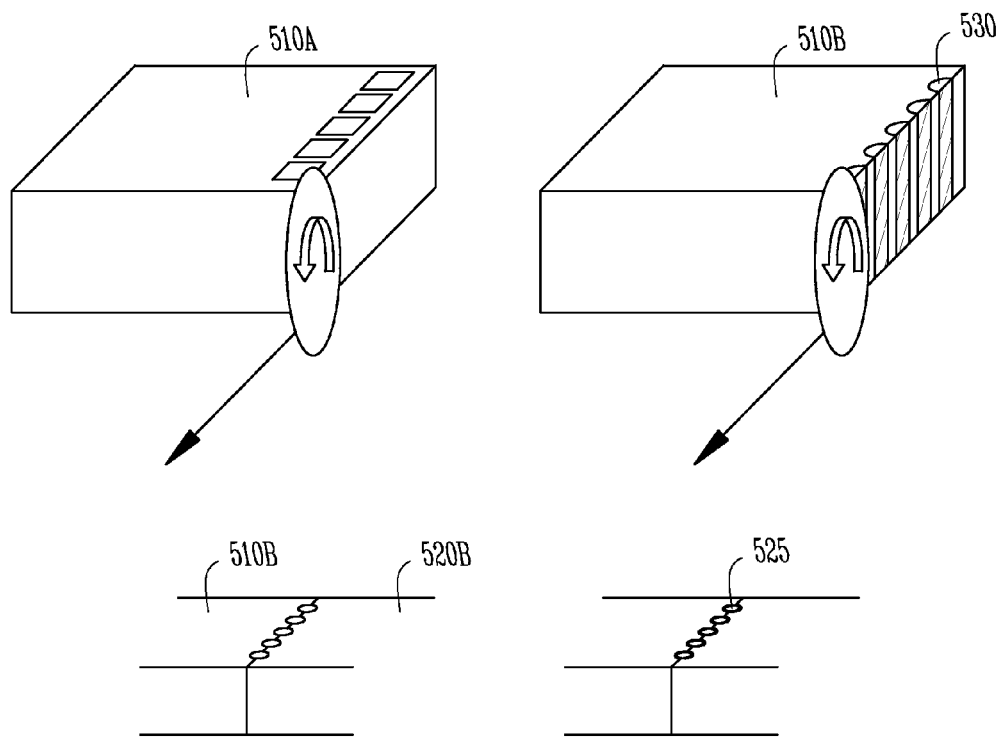
FIG. 5 illustrates an example of forming multi-surface contact pads that extend from the top surface to the bottom surface of an IC die in accordance with some embodiments.

A multi-surface contact pad may extend further down the sidewall surface of an IC die. This can be useful to increase the vertical sidewall connection between IC dice. In some examples, a multi-surface contact pad may extend from the top surface to the bottom surface of the IC die. Some examples of multi-surface contact pads that extend from the top surface to the bottom surface of the IC die are shown in FIG. 5. The multi-surface contact pads may be formed using contact pads as shown in IC die 510A. The vertical portion may be extended on the sidewall surface using a plating process. In some examples, a multi-surface contact pad may be formed using a through substrate via 530 (TSV) as shown in IC die 510B. TSVs can be formed using metal and can be exposed through sawing. The exposed contacts can extend from the top surface to the bottom surface of the IC die. The multi-surface contact pad can include a bottom surface substantially in the same plane as the bottom surface of the IC die. This can facilitate bonding to the bottom surface of the IC die. The IC die 510B can be arranged adjacent to a second IC die 520B that also includes one or more multi-surface contact pads.

The contact between IC die can be made using a compression bond between the multi-surface contact pads of the IC dice or by and electrically conductive bond 525 at the top surface (or bottom surface) of the multi-surface contact pads. The TSVs may not extend all the way through between the top and bottom surfaces. The TSV may be formed of a harder metal than what is used for a contact pad to reduce metal smearing during sawing. In certain examples, a polishing process is used to remove any unwanted metal from the side surface or surfaces of the IC die.

Figures 6A, 6B:
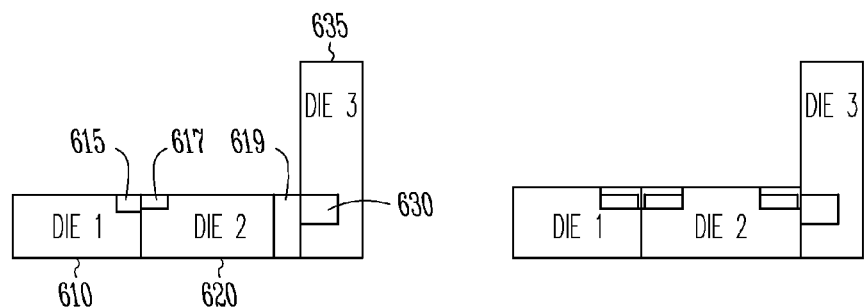
FIGS. 6A and 6B illustrate additional examples of an IC die assembly in accordance with some embodiments.

FIGS. 6A and 6B show additional examples of an IC die assembly. FIG. 6A shows a first IC die 610 and a second IC die 620. Each IC die includes a top surface and sidewall surfaces. The second IC die 620 includes multi-surface contact pads at multiple side sidewall surfaces of the IC die. One or more multi-surface contact pads 615 of the first IC die 610 and one or more multi-contact pads 617 of the second IC die 620 can be electrically bonded as described previously herein in regard to FIG. 3. The IC die assembly can include a third IC die 635 having at least one top-surface contact pad 630. The third IC die 635 is arranged so that the top surface of the second IC die 620 is adjacent the side surface of the second IC die 620. An electrically conductive bond is in contact with the side surface of the multi-surface contact pad 619 of the second IC die 620 and the top-surface contact pad 630 of the third IC die 635. Additional die can be added three dimensionally. For instance, a fourth die may be arranged above the second IC die 620 and adjacent the third IC die 635. The fourth IC die may contact one or more of the first, second, and third IC die. In certain examples, space between IC die is reserved for channels to promote cooling.

In some examples, the top-surface contact pad 630 of the third IC die 635 is included in a TSV of the third IC die 635. In some examples, the top-surface contact pad 630 of the third IC die 635 is included in multi-surface contact pad of the third IC die 635. In some examples, the multi-surface contact pad of the second IC die 620 is included in an exposed TSV of the second IC die 620. FIG. 6B shows IC die assembly of the example of FIG. 6A where one or more of the multi-surface contact pads of the IC dice include a first pad portion formed during a wafer metallization process and a second pad portion formed during at least one of a plating process or a deposition process. As explained previously in regard to FIG. 4, the plating process or the deposition process can result in a contact pad better suited for soldering.

Figure 7:
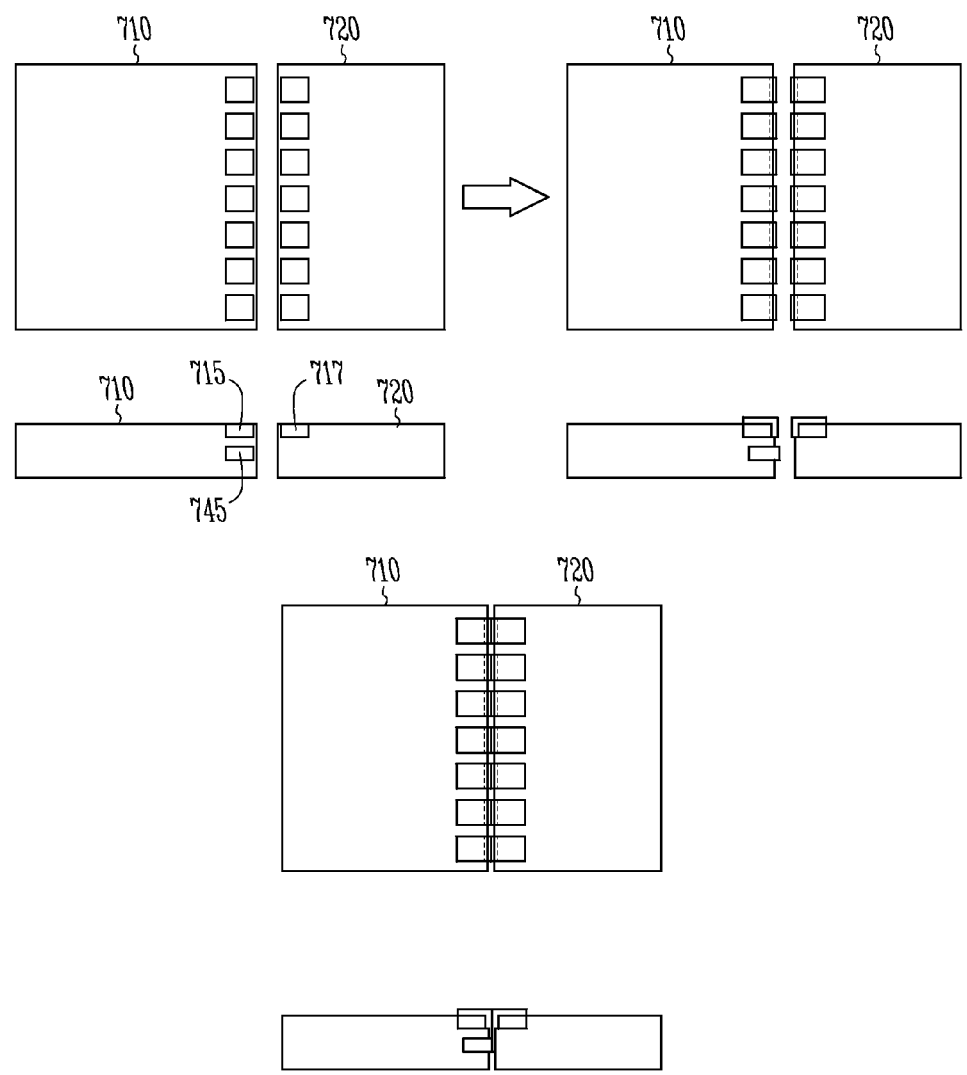
FIG. 7 illustrates still another example of an IC die assembly in accordance with some embodiments.

FIG. 7 shows still another example of an IC die assembly. The assembly includes a first IC die 710 having at least one multi-surface contact pad 715 and a second IC die 720 having at least one multi-surface contact pad 717. The first IC die 710 includes at least a second contact pad 745 arranged at an intermediate position between the top surface of the first IC die 710 and the bottom surface of the first IC die 710. An exposed surface of the second contact pad 745 is substantially in the same plane as the side wall surface of the first IC die 710. The contact pads can be formed using a wafer metallization process and one or more of the contact pads 715, 717, and 745 can be completed using an additional plating or deposition process to create a solderable or bondable contact pad. The second IC die 720 can be arranged adjacent to the first IC die 710 and an electrically conductive bond (e.g., a solder mass) can be formed to contact i) at least one of the top surface or the sidewall surface of the multi-surface contact pad of the first IC die, ii) at least one of the top surface or sidewall surface of the multi-surface contact pad of the second IC die, and iii) the side surface of the second contact pad of the first IC die.

The several examples of IC die assemblies described herein can be included in a multi-chip module (MCM) that includes two or more IC dice mounted on a substrate. The IC dice can include multi-surface contact pads for die edge-side connections, and one or both of top surface contact pads and bottom surface contact pads for additional electrical connections. The MCM can include wire bond connections to one or both of the multi-surface contact pads and the top surface contact pads. One or more of the IC die can be mounted on its side to provide an electrical connection between a multi-surface contact pad of one IC die and a top or bottom surface contact pad of another IC die.

Figure 8:
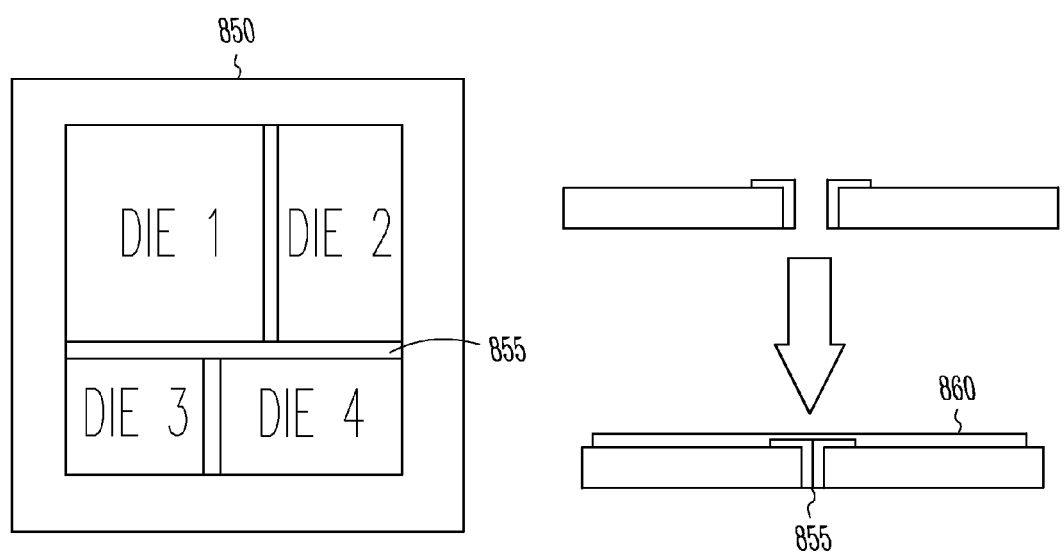
FIG. 8 shows a block diagram of portions of an example of a multi-chip module in accordance with some embodiments.

FIG. 8 shows an example of a MCM. The MCM can include a substrate 850 and two or more IC dice mounted on the substrate 850. An example of four IC dice is shown in the Figure and each IC die is shown arranged adjacent to at least two other IC dice. The bottom surfaces of the IC dice are in contact with the substrate 850. In certain examples, a sidewall surface of one or more IC dice is in contact with the substrate 850.

The MCM can include electrically conductive bonds of a first type 855. The first type of electrically conductive bonds form edge connections between the IC dice. An electrically conductive bond of the first type contacts one or both of the top surface and the side surface of a multi-surface contact pad of two IC dice. The first type of electrically conductive bonds can include a single solder mass or a very short wire bond. The substrate 850 can include contact pads and the MCM can include a second type of electrically conductive bond 860. An electrically conductive bond of the second type is in contact with a contact pad of the substrate and one or more top surface contact pads of the IC dice. The second type of electrically conductive bonds can include wire bonds. The MCM can be formed by first forming the edge connections and then adding the wire bonds.

The MCM can also include electrically conductive interconnect between multi-surface contact pads and top surface contact pads. One or more IC die can include bottom surface contact pads to contact the contact pads of the substrate. The bottom surface contact pads can included in TSVs. The MCM can be provided in a single package. One or more of the IC dice include a processor circuit. The MCM may include a memory IC die.

The several examples described herein describe devices, methods, and systems that shorten the interconnections between ICs, which can reduce RC coupling and reduce interconnection complexity. The examples also provide high density of integrated circuits without enlarging IC die. Smaller IC die typically have a higher yield due to distribution of faults in the wafer. Thus, the reduced complexity and increased density using smaller IC die can reduce the cost of electronic systems.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

ADDITIONAL EXAMPLES

To better illustrate the methods and apparatuses disclosed herein, a non-limiting list of examples is provided below.

Example 1 can include subject matter (such as an apparatus) including a first IC die and a second IC die. The first IC can include a top layer, a bottom surface, a sidewall surface extending from a top surface of the top layer to the bottom surface, and at least one multi-surface contact pad. A multi-surface contact pad includes a top surface substantially in the same plane as the top surface of the top layer of the IC die and a side surface substantially in the same plane as the sidewall surface of the IC die. The second IC die can include a top layer, a bottom surface, a sidewall surface extending from a top surface of the top layer to the bottom surface, and at least one multi-surface contact pad. The second IC die is optionally arranged adjacent to the first IC die. The apparatus can further include an electrically conductive bond in contact with at least one of the top surface or the side surface of the multi-surface contact pad of the first IC die and the top surface of the multi-surface contact pad of the second IC die.

In Example 2, the subject matter of Example 1 can optionally include an electrically conductive bond that is a single solder mass arranged on the top surfaces of both multi-surface contact pads.

In Example 3, the subject matter of one or any combination of Examples 1 and 2 optionally includes an electrically conductive bond that is a wire bond between the multi-surface contact pad of the first IC die and the multi-surface contact pad of the second IC die.

In Example 4, the subject matter of one or any combination of Example 1-3 optionally includes a multi-surface contact pad extends from the top surface to the bottom surface of the IC die. The multi-surface contact pad optionally includes a bottom surface substantially in the same plane as the bottom surface of the IC die.

In Example 5, the subject matter of one or any combination of Examples 1-4 optionally includes an exposed through substrate via (TSV) that extends from the top surface to the bottom surface of the IC die.

In Example 6, the subject matter of one or any combination of Example 1-5 optionally includes the second IC die arranged so that the top surface of the second IC die is facing the sidewall surface of the first IC die. The electrically conductive bond optionally includes a single solder mass arranged on the side surface of the multi-surface contact of the first IC die and the top surface of the multi-surface contact of the second IC die.

In Example 7, the subject matter of one or any combination of Examples 1-5 optionally includes the first IC die having at least a second contact pad arranged at an intermediate position between the top surface of the first IC die and the bottom surface of the first IC die. A surface of the second contact pad is optionally arranged substantially in the same plane as the side wall surface, and wherein the electrically conductive bond is a solder mass in electrical contact with i) at least one of the top surface or the side surface of the multi-surface contact pad of the first IC die, ii) at least one of the top surface or sidewall surface of the multi-surface contact pad of the second IC die, and iii) the surface of the second contact pad of the first IC die.

In Example 8, the subject matter of one or any combination of Examples 1-7 optionally includes a compression bond between the multi-surface contact pad of the first IC die and the multi-surface contact pad of the second IC die.

In Example 9, the subject matter of one or any combination of Examples 1-8 optionally includes the first IC die having at least one top surface contact pad and the second IC die having at least one top surface contact pad. The apparatus optionally includes electrically conductive interconnect between the at least one top surface contact pad of the first IC die and the at least one top surface contact pad of the second IC die.

In Example 10, the subject matter of one or any combination of Examples 1-9 optionally includes a multi-surface contact pad that includes a first pad portion formed during a wafer metallization process and a second pad portion formed during at least one of a plating process or a deposition process.

Example 11 can include subject matter (such as a multi-chip module), or can optionally be combined with one or any combination of Examples 1-10 to include such subject matter, including a first IC die, at least one second IC die, a substrate, a first plurality of electrically conductive bonds, and a second plurality of electrically conductive bonds. The first IC die optionally includes a top layer, a bottom surface, a sidewall surface extending from a top surface of the top layer to the bottom surface, a plurality of top surface contact pads, and a plurality of multi-surface contact pads. The multi-surface contact pad includes a top surface substantially in the same plane as the top surface of the top layer of the IC die and a side surface substantially in the same plane as the sidewall surface of the IC die. The at least one second IC die including a top layer, a bottom surface, a sidewall surface extending from a top surface of the top layer to the bottom surface, a plurality of top surface contacts pads, and a plurality of multi-surface contact pads. The at least one second integrated circuit die is optionally arranged adjacent to the first integrated circuit die. The substrate includes contact pads and the bottom surfaces of the first IC die and the at least one second IC die are in contact with the substrate. An electrically conductive bond of the first plurality is optionally in contact with at least one of the top surface or the side surface of a multi-surface contact pad of the first IC die and at least one of the top surface or side surface of a multi-surface contact pad of the second IC die.

The second plurality of electrically conductive bonds is optionally in contact with contacts pads of the substrate and top surface contact pads of at least one of the first IC die and the at least one second IC die.

In Example 12, the subject matter of Example 11 optionally includes the first plurality of electrically conductive bonds having at least one unified solder mass arranged on both a top surface of a multi-surface contact pad of the first IC die and a top surface of a multi-surface contact pad of the second IC die.

In Example 13, the subject matter of one or any combination of Examples 11 and 12 optionally includes at least one multi-surface contact pad that extends from the top surface to the bottom surface of an IC die and includes a bottom surface substantially in the same plane as the bottom surface of the IC die. The substrate optionally includes at least one contact pad in electrical contact with the bottom surface of the multi-surface contact pad.

In Example 14, the subject matter of one or any combination of Examples 11-13 optionally includes the at least one second IC die arranged so that the top surface of the second IC die is facing the sidewall surface of the first IC die. The plurality of electrically conductive bonds optionally includes at least one solder mass arranged on a side surface of at least one multi-surface contact pad of the first IC die and a top surface of at least one multi-surface contact of the second IC die.

In Example 15, the subject matter of one or any combination of Examples 11-14 optionally includes the first IC die including a processor circuit.

Example 16 can include subject matter (such as a method or process), or can optionally be combined with the subject matter of any or any combination of Examples 1-15 to include such subject matter, including separating an IC die from a wafer. The separated IC die includes a top layer, a bottom surface, a sidewall surface extending from a top surface of the top layer to the bottom surface, and at least one multi-surface contact pad. A multi-surface contact pad includes a top surface substantially in the same plane as the top surface of the top layer of the separated IC die. The subject matter further includes exposing a side surface of the at least one multi-surface contact pad, wherein the side surface of the at least one multi-surface contact pad is substantially in the same plane as the sidewall surface of the separated IC die, arranging the separated IC die substantially adjacent to a second IC die, wherein the second IC die includes a multi-surface contact pad, and forming an electrically conductive bond between at least one of the top surface or the side surface of the multi-surface contact pad of the separated IC die and a top surface of the multi-surface contact pad of the second IC die.

In Example 17, the subject matter of Example 16 optionally includes arranging a single solder mass on the top surface of the multi-surface contact pad of the separated IC die and the multi-surface contact pad of the second IC die.

In Example 18, the subject matter of one or any combination of Examples 16 and 17 optionally includes exposing a through substrate via to expose a side surface of the at least one multi-surface contact pad.

In Example 19, the subject matter of one or any combination of Examples 16-18 optionally includes exposing a second contact pad on the side wall of the separated IC die and arranged at an intermediate position between the top surface of the first IC die and the bottom surface of the first IC die, and forming an electrically conductive bond between the second contact of the separated IC die and the multi-surface contact pad of the second IC die.

In Example 20, the subject matter of one or any combination of Examples 16-19 optionally includes arranging the separated IC die so that the top surface of the separated IC die is facing the sidewall surface of the second IC die, and wherein forming the electrically conductive bond includes arranging a single solder mass on the top surface of the separated IC die and the sidewall surface of the second IC die.

Example 21 can include subject matter (such as an apparatus), or can optionally be combined with the subject matter of one or any combination of Examples 1-20 to include such subject matter, including a first IC die and a second IC die. The first IC die optionally includes a top layer, a bottom surface, a sidewall surface extending from a top surface of the top layer to the bottom surface, and at least one multi-surface contact pad. A multi-surface contact pad can include a top surface substantially in the same plane as the top surface of the top layer of the first IC die and a side surface substantially in the same plane as the sidewall surface of the first IC die. The second IC die can include a top layer, a bottom surface, a sidewall surface extending from a top surface of the top layer to the bottom surface, and at least one top-surface contact pad. The second IC die is optionally arranged so that the top surface of the second IC die is adjacent to the side surface of the first IC die. The apparatus can further include an electrically conductive bond in contact with the side surface of the at least one multi-surface contact pad of the first IC die and the at least one top-surface contact pad of the second IC die.

In Example 22, the subject matter of Example 21 optionally includes a through substrate via that includes the at least one top surface contact pad of the second IC die.

In Example 23, the subject matter of one or any combination of Examples 21 and 22 optionally includes a through substrate via that includes the multi-surface contact pad of the first IC die.

In Example 24, the subject matter of one or any combination of Examples 21-23 optionally includes a multi-surface contact pad of the first IC die including a first pad portion formed during a wafer metallization process and a second pad portion formed during at least one of a plating process or a deposition process.

Example 25 can include subject matter, or can optionally be combined with any portion or combination of any portions of any one or more of Examples 1 through 24 to include subject matter, that can include means for performing any one or more of the functions of Examples 1 through 24, or a machine-readable medium including instructions that, when performed by a machine, cause the machine to perform any one or more of the functions of Examples 1 through 24.

Each of these non-limiting examples can stand on its own, or can be combined in various permutations or combinations with one or more of the other examples.

What is claimed is:
1. An apparatus comprising:
  a first integrated circuit (IC) die including a top layer, a bottom surface, a sidewall surface extending from a top surface of the top layer to the bottom surface, and at least one multi-surface contact pad, wherein the at least one multi-surface contact pad includes a top surface substantially in the same plane as the top surface of the top layer of the first IC die and a side surface substantially in the same plane as the sidewall surface of the first IC die;
  a second IC die including a top layer, a bottom surface, a sidewall surface extending from a top surface of the top layer to the bottom surface, and at least one multi-surface contact pad, wherein the second IC die is arranged adjacent to the first IC die;

a substrate, wherein the bottom surfaces of the first IC die and the second IC die are in contact with the substrate; and an electrically conductive bond including the top surface and the side surface of the multi-surface contact pad of the first IC die and at least one of the top surface and the side surface of the multi-surface contact pad of the second IC die.

2. The apparatus of claim 1, wherein the electrically conductive bond is a single solder mass arranged on the top surfaces of both multi-surface contact pads.

3. The apparatus of claim 1, wherein the electrically conductive bond is a wire bond between the multi-surface contact pad of the first IC die and the multi-surface contact pad of the second IC die.

4. The apparatus of claim 1, wherein the multi-surface contact pad of at least one of the first IC die or the second IC die extends from the top surface to the bottom surface of the at least one of the first IC die or the second IC die, and wherein the multi-surface contact pad includes a bottom surface substantially in the same plane as the bottom surface of the at least one of the first IC die or the second IC die.

5. The apparatus of claim 4, wherein the multi-surface contact pad of the at least one of the first IC die or the second IC die includes an exposed through substrate via (TSV) that extends from the top surface to the bottom surface of the at least one of the first IC die or the second IC die.

6. The apparatus of claim 1, including a third IC die that includes a contact pad on a top surface, wherein the second IC includes a second multi-surface contact pad that includes a top surface substantially in the same plane as the top surface of the second IC die and a side surface substantially in the same plane as a second sidewall sidewall surface of the second IC die, wherein the third IC die is arranged so that the top surface of the third IC die is facing the second sidewall surface of the second IC die, wherein the electrically conductive bond is a single solder mass arranged on the side surface of the multi-surface contact pad of the second IC die and the contact pad of the third IC die.

7. The apparatus of claim 1, wherein the first IC die includes at least a second contact pad arranged at an intermediate position between the top surface of the first IC die and the bottom surface of the first IC die, wherein a surface of the second contact pad is substantially in the same plane as the side wall surface of the first IC die, and wherein the electrically conductive bond is a solder mass in electrical contact with the surface of the second contact pad of the first IC die, one or both of the top surface or the side surface of the multi-surface contact pad of the first IC die, and one or both of the top surface or the side surface of the multi-surface contact pad of the second IC die.

8. The apparatus of claim 1, wherein the electrically conductive bond includes a compression bond between the multi-surface contact pad of the first IC die and the multi-surface contact pad of the second IC die.

9. The apparatus of claim 1, wherein the first IC die includes at least one top surface contact pad and the second IC die includes at least one top surface contact pad, and wherein the apparatus includes electrically conductive interconnect between the at least one top surface contact pad of the first IC die and the at least one top surface contact pad of the second IC die.

10. The apparatus of claim 1, wherein the multi-surface contact pad of the first IC die includes a top surface metalized pad portion and a side surface metalized pad portion.

11. A multi-chip module comprising:
a first IC die including a top layer, a bottom surface, a sidewall surface extending from a top surface of the top layer to the bottom surface, a plurality of top surface contact pads, and a plurality of multi-surface contact pads, wherein a multi-surface contact pad includes a top surface substantially in the same plane as the top surface of the top layer of the first IC die and a side surface substantially in the same plane as the sidewall surface of the first IC die;

at least one second IC die including a top layer, a bottom surface, a sidewall surface extending from a top surface of the top layer to the bottom surface, a plurality of top surface contacts pads, and a plurality of multi-surface contact pads, wherein the at least one second IC die is arranged adjacent to the first IC die;

a substrate, wherein the bottom surfaces of the first IC die and the at least one second IC die are in contact with the substrate, and wherein the substrate includes contact pads;

a first plurality of electrically conductive bonds, wherein an electrically conductive bond of the first plurality of electrically conductive bonds is in contact with at least one of the top surface or the side surface of a multi-surface contact pad of the first IC die and at least one of the top surface or side surface of a multi-surface contact pad of the second IC die; and a second plurality of electrically conductive bonds in contact with contacts pads of the substrate and top surface contact pads of at least one of the first IC die and the at least one second IC die.

12. The multi-chip module of claim 11, wherein the first plurality of electrically conductive bonds includes at least one unified solder mass arranged on both a top surface of a multi-surface contact pad of the first IC die and a top surface of a multi-surface contact pad of the second IC die.

13. The multi-chip module of claim 11, wherein at least one multi-surface contact pad extends from the top surface to the bottom surface of an IC die and includes a bottom surface substantially in the same plane as the bottom surface of the IC die, and wherein the substrate includes at least one contact pad in electrical contact with the bottom surface of the multi-surface contact pad.

14. The multi-chip module of claim 11, wherein the at least one second IC die is arranged so that the top surface of the second IC die is facing the sidewall surface of the first IC die, wherein the plurality of electrically conductive bonds includes at least one solder mass arranged on a side surface of at least one multi-surface contact pad of the first IC die and a top surface of at least one multi-surface contact of the second IC die.

15. The multi-chip module of claim 11, wherein the first IC die includes a processor circuit.

16. A method comprising:
separating an IC die from a wafer, wherein the separated IC die includes a top layer, a bottom surface, a sidewall surface extending from a top surface of the top layer to the bottom surface, and at least one multi-surface contact pad, wherein the at least one multi-surface contact pad includes a top surface substantially in the same plane as the top surface of the top layer of the separated IC die;

exposing a side surface of the at least one multi-surface contact pad, wherein the side surface of the at least one multi-surface contact pad is substantially in the same plane as the sidewall surface of the separated IC die;

arranging the separated IC die substantially adjacent to a second IC die, wherein the second IC die includes a multi-surface contact pad;

positioning the bottom surfaces of the seperated IC die and the second IC die to be in contact with a top surface of a substrate; and forming an electrically conductive bond including the top surface and the side surface of the multi-surface contact pad of the separated IC die and at least one of a top surface and a side surface of the multi-surface contact pad of the second IC die.

17. The method of claim 16, wherein forming the electrically conductive bond includes arranging a single solder mass on the top surface of the multi-surface contact pad of the separated IC die and the multi-surface contact pad of the second IC die.

18. The method of claim 16, wherein exposing a side surface of the at least one multi-surface contact pad of the separated IC die includes exposing a through substrate via (TSV).

19. The method of claim 16, including exposing a second contact pad on the side wall of the separated IC die and arranged at an intermediate position between the top surface of the first IC die and the bottom surface of the first IC die, and forming an electrically conductive bond between the second contact pad of the separated IC die and the multi-surface contact pad of the second IC die.

20. The method of claim 16, wherein arranging the separated IC die includes arranging the separated IC die so that the side surface of the at least one multi-surface contact pad of the separated IC die is facing a top surface of the at least one multi-surface contact pad of the second IC die, and wherein forming the electrically conductive bond includes arranging a single solder mass on the top surface of the separated IC die and the sidewall surface of the second IC die.

21. The method of claim 16, including forming a first pad portion of the multi-surface contact pad of the separated IC die during a wafer metallization process and forming a second pad portion of the multi-surface contact pad of the separated IC die during at least one of a plating process or a deposition process.

22. An apparatus comprising:
a first integrated circuit (IC) die including a top layer, a bottom surface, a sidewall surface extending from a top surface of the top layer to the bottom surface, and at least one multi-surface contact pad, wherein the at least one multi-surface contact pad includes a top surface substantially in the same plane as the top surface of the top layer of the first IC die and a side surface substantially in the same plane as the sidewall surface of the first IC die, wherein the multi-surface contact pad of the first IC die is included in an exposed TSV extending from the top layer to the bottom surface;

a second IC die including a top layer, a bottom surface, a sidewall surface extending from a top surface of the top layer to the bottom surface, and at least one top-surface contact pad, wherein the second IC die is arranged so that the top surface of the second IC die is facing and adjacent to the sidewall surface of the first IC die; and an electrically conductive bond in contact with the side surface of the at least one multi-surface contact pad of the first IC die and the at least one top-surface contact pad of the second IC die, wherein the electrically conductive bond is a single solder mass arranged on the sidewall surface of the first IC die and the top surface of the second IC die.

23. The apparatus of claim 22, wherein the at least one top surface contact pad of the second IC die is included in a TSV.

24. The apparatus of claim 23, wherein the multi-surface contact pad of the first IC die is included in an exposed TSV.

* * * * *